United States Patent [19]

Ishino et al.

[11] Patent Number: 4,961,198
[45] Date of Patent: Oct. 2, 1990

[54] SEMICONDUCTOR DEVICE

[75] Inventors: Masato Ishino; Yoichi Sasai, both of Osaka, Japan

[73] Assignee: Matsushita Electric Industrial Co., Ltd., Japan

[21] Appl. No.: 296,020

[22] Filed: Jan. 12, 1989

[30] Foreign Application Priority Data

Jan. 14, 1988 [JP] Japan .................................. 63-5809
Jun. 21, 1988 [JP] Japan ................................ 63-153241

[51] Int. Cl.$^5$ ............................................. H01S 3/19
[52] U.S. Cl. ..................................... 372/50; 357/16; 357/17; 357/56; 372/45
[58] Field of Search ...................... 372/44, 45, 50, 96; 357/16, 17, 56

[56] References Cited

U.S. PATENT DOCUMENTS

| 4,815,087 | 3/1989 | Hayashi | 372/45 |
| 4,815,090 | 3/1989 | Usami et al. | 372/45 |
| 4,820,655 | 4/1989 | Noda et al. | 372/45 |
| 4,829,535 | 5/1989 | Utaka | 372/45 |

Primary Examiner—James W. Davie
Attorney, Agent, or Firm—Lowe, Price, LeBlanc, Becker & Shur

[57] ABSTRACT

A semiconductor device includes a semiconductor substrate having a plurality of mesa stripes whose widths are different from each other. Quantum well layers are formed on the mesa stripes respectively and have different band gap energies. The quantum well layers include ultra-thin epitaxial layers respectively. Semiconductor elements are formed on the mesa stripes respectively and include the quantum well layers respectively. Thicknesses of the ultra-thin layers are preferably equal to or less than 500 angstroms.

13 Claims, 6 Drawing Sheets

SEMICONDUCTOR DEVICE

BACKGROUND OF THE INVENTION

This invention relates to semiconductor devices such as integrated optoelectronic devices or integrated multi-wavelength laser arrays. This invention also relates to a method of fabricating such semiconductor devices.

In the field of optical communication, advanced optical repeaters and switchboards use integrated optoelectronic devices in which light sources, photodetectors, and control elements are integrated on a common substrate.

Integrated multi-wavelength laser arrays are useful for frequency multiplexing optical fiber communication.

In general, prior-art methods of fabricating semiconductor devices such as integrated optoelectronic devices or integrated multi-wavelength laser arrays are complicated. The complicatedness in fabrication tends to adversely affect the performance and reliability of produced semiconductor devices.

SUMMARY OF THE INVENTION

It is an object of this invention to provide a reliable semiconductor device such as an integrated optoelectronic device or an integrated multi-wavelength laser array.

It is another object of this invention to provide an easy method of fabricating a semiconductor device.

In accordance with a first aspect of this invention, a semiconductor device includes a semiconductor substrate having a plurality of mesa stripes whose widths are different from each other. Quantum well layers are formed on the mesa stripes respectively and have different band gap energies. The quantum well layers include ultra-thin epitaxial layers respectively. Semiconductor elements are formed on the mesa stripes respectively and include the quantum well layers respectively. Thicknesses of the ultra-thin layers are preferably equal to or less than 500 angstroms.

In accordance with a second aspect of this invention, a semiconductor laser device includes a semiconductor substrate. A light source is formed on the substrate and has an active layer and grating. The active layer and the grating cooperate and emit light having a wavelength determined by the grating. An optical waveguide is formed on the substrate and has a waveguide layer guiding the light from the light source. The active layer and the waveguide layer comprise a quantum well layer. A thickness of a portion of the quantum well layer which extends in the light source is greater than a thickness of a portion of the quantum well layer which extends in the optical waveguide.

In accordance with a third aspect of this invention, a semiconductor laser device includes a semiconductor substrate. A light source is formed on the substrate and has an active layer. The light source emits light. An optical waveguide is formed on the substrate and guides the light from the light source. The optical waveguide has a waveguide layer and a grating which determines a wavelength of the light emitted from the light source. The active layer and the waveguide layer comprise a quantum well layer. A thickness of a portion of the quantum well layer which extends in the light source is greater than a thickness of a portion of the quantum well layer which extends in the optical waveguide.

In a method according to a fourth aspect of this invention, a plurality of mesa stripes are formed on a semiconductor substrate. The mesa stripes have respective widths different from each other. A quantum well layer is formed on the mesa-formed substrate in epitaxial growth. The quantum well layer includes at least one ultra-thin layer. Semiconductor elements are formed on the respective mesa stripes. The semiconductor elements have different band gap energies and include the quantum well layer. A thickness of the ultra-thin layer is preferably equal to or less than 500 angstroms.

BRIEF DESCRIPTION OF THE DRAWINGS

In general, like and corresponding elements are denoted by the same reference characters throughout the drawings.

DESCRIPTION OF THE FIRST PREFERRED EMBODIMENT

Figure 1:
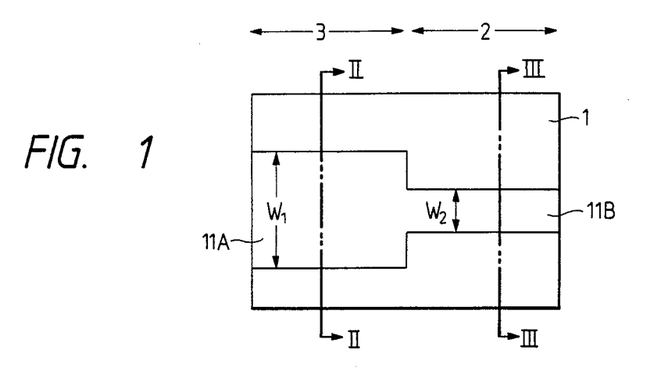
FIG. 1 is a plan view of an integrated optoelectronic device according to a first embodiment of this invention.
Figure 2:
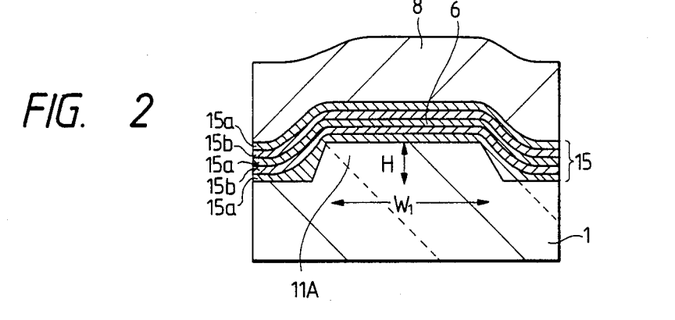
FIG. 2 is a sectional view of the integrated optoelectronic device taken along the line II—II of FIG. 1.
Figure 3:
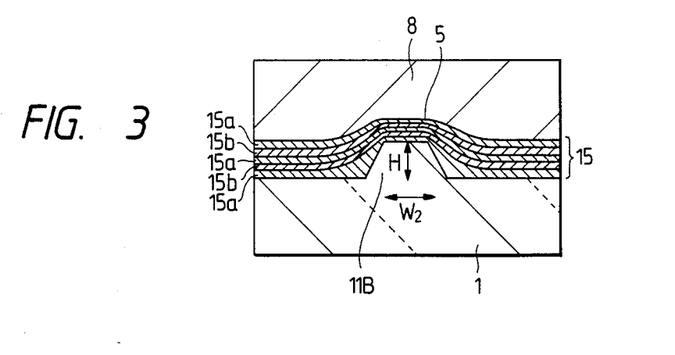
FIG. 3 is a sectional view of the integrated optoelectronic device taken along the line III—III of FIG. 1.

FIGS. 1-3 show an integrated optoelectronic device in which a semiconductor laser and a waveguide are integrated on an n-type InP substrate 1. The integrated optoelectronic device includes a waveguide region or section 2 and a laser light source region or section 3.

In the light source region 3, a mesa stripe 11A having a width W1 is formed on the InP substrate 1. In the waveguide region 2, a mesa stripe 11B having a width W2 is formed on the InP substrate 1. The mesa stripes 11A and 11B have a common longitudinal axis and are aligned. In addition, the mesa stripes 11A and 11B join continuously and are integral with each other. The InP substrate 1 with the mesa stripes 11A and 11B is preferably formed by the steps including a patterning process using an SiO$_2$ mask, an etching process using Hcl/H$_3$PO$_4$-based etchant, and a mask removing process. The height of the mesa stripes 11A and 11B is prefarably about 1 micrometer.

A multi-quantum-well (MQW) laminated structure 15 composed of InGaAsP well layers 15b and InP barrier layers 15a is formed on the InP substrate 1 by liquid phase epitaxy (referred to as the LPE method hereinafter). The MQW structure 15 in the light source region 3 forms active layers 6 above the mesa stripe 11A. The MQW structure 15 in the waveguide region 2 forms waveguide layers 5 above the mesa stripe 11B. A p-type InP cladding layer 8 having a thickness of about 2 micrometers is formed on the MQW structure 15. In general, a p-type InGaAsP contact layer (not shown in FIGS. 2 and 3) is formed on the InP cladding layer 8.

Figure 4A:
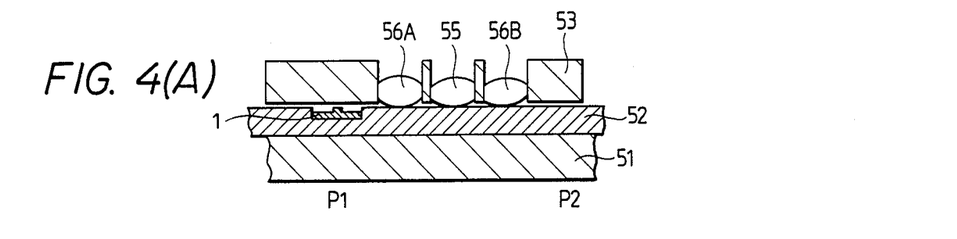
FIGS. 4(A)-4(D) are sectional views of members in fabricating processes related to the first embodiment of this invention.
Figure 4B:
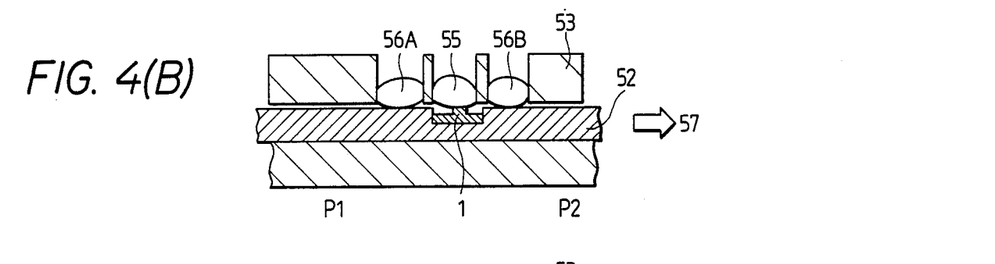
Figure 4C:
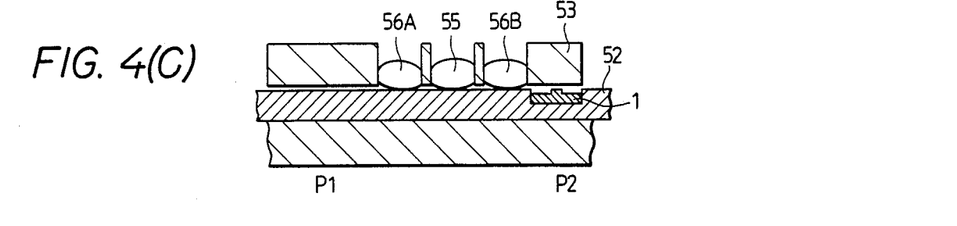

The LPE method of forming the MQW structure 15 will be described hereinafter. As shown in FIG. 4, the InP substrate 1 with the mesa stripes is fitted into a recess in a growth boat slider 52. The slider 52 is movable on a growth boat base 51. The InP substrate 1 moves together with the slider 52. Under initial conditions, the InP substrate 1 assumes a position Pl as shown in FIG. 4(A). After the initial conditions, the slider 52 is moved in a rightward direction 57 so that the InP substrate 1 also moves rightward from the initial position Pl as shown in FIG. 4(B). As shown in FIG. 4(C), when the InP substrate 1 reaches a position P2, the slider 52 is stopped. This movement of the InP substrate 1 is held continual so that the InP substrate 1 does not stop at a position intermediate between the positions Pl and P2. During the movement of the InP substrate 1 from the position Pl to the position P2, the InP substrate 1 sequentially meets InP melt 56A, InGaAsP melt 55, and InP melt 56B so that an InP layer, an InGaAsP layer, and an InP layer are formed on the InP substrate 1 in a laminated manner. The melts 55, 56A, and 56B are contained in a melt holder 53 placed immediately above the slider 52.

Figure 4D:
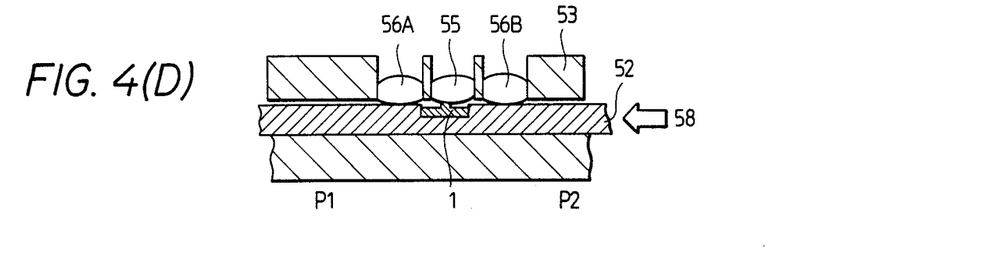

Then, the slider 52 is moved in a leftward direction 58 so that the InP substrate 1 also moves leftward from the position P2 as shown in FIG. 4(D). When the InP substrate 1 returns to the position Pl, the slider 52 is stopped. This movement of the InP substrate 1 is held continual so that the InP substrate 1 does not stop at a position intermediate between the positions Pl and P2. During the movement of the InP substrate 1 from the position P2 to the position Pl, the InP substrate 1 sequentially meets the InP melt 56B, the InGaAsP melt 55, and the InP melt 56A so that an InP layer, an InGaAsP layer, and an InP layer are additionally formed on the InP substrate 1 in a laminated manner.

In this way, the MQW structure 15 which includes the InGaAsP well layers 15a and the InP barrier layers 15b is formed on the InP substrate 1 with the mesa stripes 11A and 11B. These processes including the rightward and leftward movements of the slider 52 may be reiterated twice or more. Only one rightward movement of the slider 52 may be performed for a single-quantum-well laminated structure.

Figure 5:
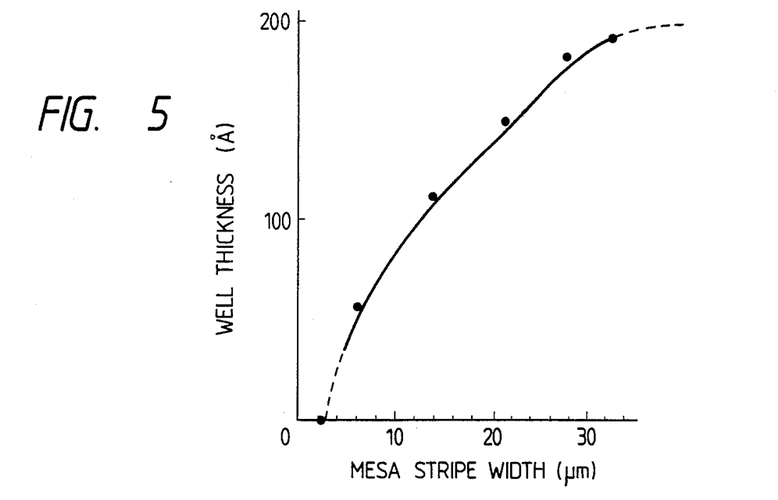
FIG. 5 is a diagram showing the relationship between the width of a mesa stripe and the thickness of an InGaAsP well layer in the first embodiment of this invention.

FIG. 5 shows the experimental results of the relationship between the thicknesses of In$_{0.8}$Ga$_{0.2}$As$_{0.46}$P$_{0.54}$ well layers and the widths of the mesa stripes. The well layers were formed by the LPE method under conditions where the growth temperature was 590° C., the sliding speed of the boat slider was 30 mm/sec, the width of the InP substrate was 10 mm, and the width of holes via which the melts flowed onto the substrate was 7 mm, and the height of the mesa stripes was 1 micrometer. As shown in FIG. 5, the thickness of the InGaAsP well layer which was formed on the mesa stripe increased as the width of the mesa stripe increased. In the case of the flat substrate portion without any mesa stripe, that is, in the case where the width of the mesa stripe was infinite, the thickness of the formed well layer was about 200 angstroms. In the case where the width of the mesa stripe was equal to or less than 3 micrometers, no growth occurred. This resulted for the following reason. The solute in the melt concentrated on the side walls of the mesa stripe so that the effective super-saturation of the melt above the mesa stripe decreased. It is understood from FIG. 5 that the thickness of an epitaxial layer can be controlled in accordance with the width of a mesa stripe in a range of 3 to 30 micrometers.

Figure 6:
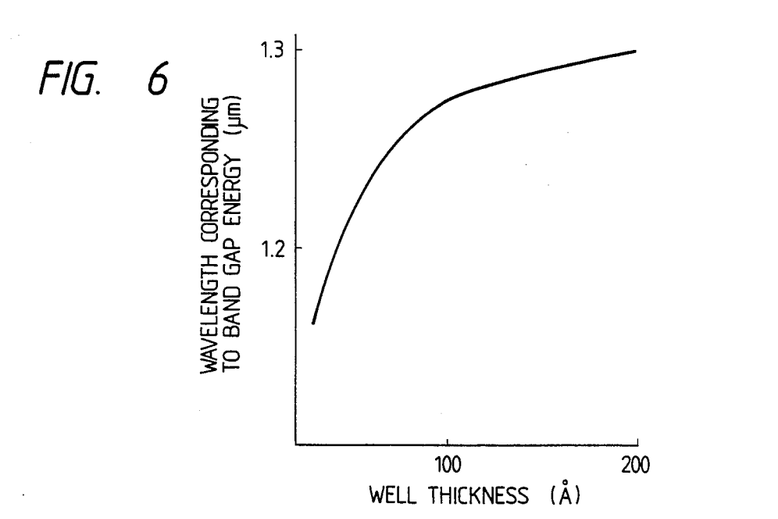
FIG. 6 is a diagram showing the relationship between the thickness of an InGaAsP well layer and the wavelength corresponding to a band gap energy in the first embodiment of this invention.

FIG. 6 shows the experimental results of the relationship between the thicknesses of the InGaAsP well layers and the wavelengths corresponding to the band gap energies ($\lambda$g) in the range where the thicknesses of the InGaAsP well layers were smaller than 200 angstroms. In the range where the thicknesses of the InGaAsP well layers were equal to or greater than 500 angstroms, the band gap energies remained substantially unchanged independent of the thicknesses of the well layers. In the range where the thicknesses of the InGaAsP well layers were smaller than 500 angstroms, and especially in the range where the thicknesses of the InGaAsP well layers were smaller than 200 angstroms, the quantum-size effect caused the band gap energies to decrease with decreases in the thicknesses of the well layers as shown in FIG. 6.

As understood from FIG. 5, in the case where the width W1 of the mesa stripe 11A in the light source region 3 was about 30 micrometers and the width W2 of the mesa stripe 11B in the waveguide region 2 was about 6 micrometers, the thickness of the formed well layers 15b was about 200 angstroms in the light source region 3 and was about 50 angstroms in the waveguide region 2. As understood from FIG. 6, the band gap wavelength ($\lambda$g) of the MQW structure 15 was about 1.3 micrometers in the light source region 3 including the well layer with a thickness of about 200 angstroms and was about 1.23 micrometers in the waveguide region 2 including the well layer with a thickness of about 50 angstroms. Accordingly, the difference in band gap wavelength between the light source region 3 and the waveguide region 2 was about 0.07 micrometers. This difference ensures that light of 1.3-micrometer wavelength generated by the light source region 3 travels along the waveguide region 2 essentially without being absorbed by the waveguide region 2. Accordingly, the waveguide region 2 is efficient.

The active layers 6 of the light source region 3 and the waveguide layers 5 of the waveguide region 2 are composed of the same epitaxial layers or the integral epitaxial layers and have a common optical axis. Accordingly, the efficiency of the optical coupling between the light source region 3 and the waveguide region 2 can be about 80% or higher. In addition, an offset or misalignment in optical axis between the light source region 3 and the waveguide region 2 can be reliably prevented.

Figure 7:
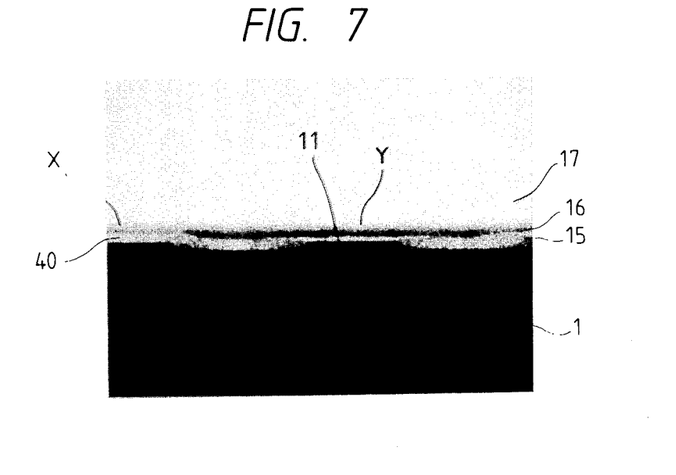
FIG. 7 is a SEM photograph showing the cross section of a grown semiconductor device wafer related to the first embodiment of this invention.
Figure 8:
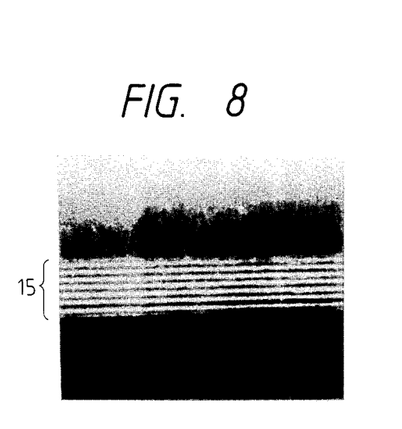
FIG. 8 is a SEM photograph which enlargingly shows a portion X of FIG. 7.
Figure 9:
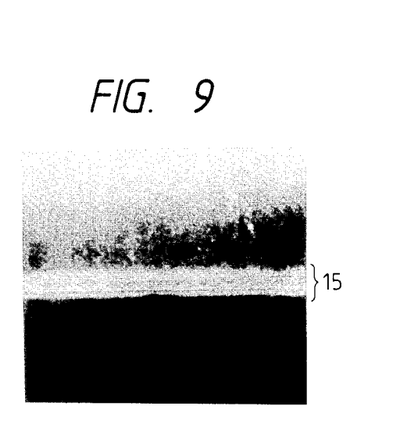
FIG. 9 is a SEM photograph which enlargingly shows a portion Y of FIG. 7.

FIG. 7 is a SEM photograph of 3,500 magnifications which shows the cross section of a grown semiconductor device wafer including an InP substrate 1, a mesa stripe 11 of a 5-micrometer width, an MQW structure 15, an InP cladding layer 16, and an InGaAsP contact layer 17. FIG. 8 is a SEM photograph of 17,000 magnifications which enlargingly shows the portion X of FIG. 7 corresponding to a flat portion 40. FIG. 9 is a SEM photograph of 17,000 magnifications which enlargingly shows the portion Y of FIG. 7 corresponding to a portion above the mesa stripe 11. As understood from FIG. 8, the thickness of the well layers of the MQW structure 15 in the flat portion 40 was about 400 angstroms. As understood from FIG. 9, the thickness of the well layers of the MQW structure 15 above the mesa stripe 11 was about 100 angstroms. In this way, there was a significant difference in the well-layer thickness between the flat portion 40 and the mesa-stripe portion so that these two portions had considerably different band gap energies.

A modification of this embodiment additionally includes a photodetector region (section) formed on an InP substrate. The InP substrate is formed with a third mesa stipe having a width which is greater than that of a mesa stripe for a light source region or a waveguide region. This design of the third mesa stripe ensures that the bandgap energy of the photodetector region is smaller than that of the light source region or the waveguide region. Accordingly, the photodetector region can efficiently receive light from the light source region or the waveguide region.

In a second modification of this embodiment, mesa stripes are formed on a grown epitaxial layer instead of an InP substrate.

In a third modification of this embodiment, mesa stripes are formed by providing double channels.

DESCRIPTION OF THE SECOND PREFERRED EMBODIMENT

Figure 10:
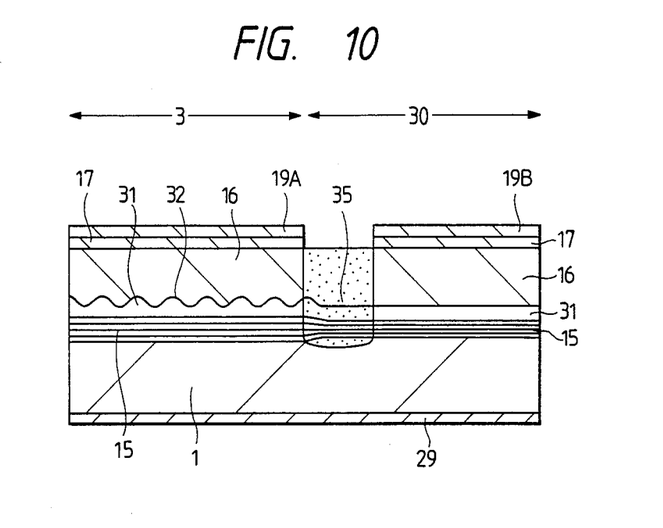
FIG. 10 is a sectional view of an integrated laser array according to a second embodiment of this invention.

With reference to FIG. 10, an integrated DFB (Distributed Feedback) laser includes a light source region 3 and a light modulation region 30. The laser includes an n-type InP substrate 1 on which an InGaAsP MQW structure 15 is formed. An InGaAsP waveguide layer 31 extends above the MQW structure 15. A P-type InP cladding layer 16 is formed on the waveguide layer 31. The light source region 3 contains a diffraction grating 32 which is formed on the waveguide layer 31 and which has a pitch of 4,000 angstroms. A p-type InGaAsP contact layer 17 is formed on the cladding layer 16. The light source region 3 includes a p-type electrode 19A extending above the contact layer 17. The light modulation region 30 includes a p-type electrode 19B extending above the contact layer 17. An n-type electrode 29 is formed below the InP substrate 1. The light source region 3 and the light modulation region 30 are electrically separated by a proton injection layer 35.

In the MQW structure 15 within the light source region 3, the thickness of well layers is about 200 angstroms and the thickness of barrier layers is also about 200 angstroms. In the MQW structure 15 within the light modulation region 30, the thickness of well layers is about 100 angstroms and the thickness of barrier layers is also about 100 angstroms. This thickness difference results in a difference in band gap energy between the light source region 3 and the light modulation region 30. Specifically, the MQW structure 15 has a band gap wavelength ($\lambda g$) of about 1.29 micrometers in the light source region 3 and has a band gap wavelength ($\lambda g$) of about 1.27 micrometers in the light modulation region 30.

In this way, the thicknesses of the same layers within a common wafer vary in dependence upon the region where the layers extend. As in the embodiment of FIGS. 1-9, this design was obtained by an LPE method using a substrate formed with a mesa stripe whose width varied in dependence upon the region where the mesa stripe extended. Specifically, only the light modulation region 30 was formed with a mesa stripe which extended along an optical axis and which had a width of about 8 micrometers.

When a forward-direction dc current is passed between the electrodes 19A and 29 in the light source region 3, laser oscillation occurs which emits light having a wavelength of 1.30 micrometers. The MQW structure 15 in the light modulation region 30 guides the laser light with a loss of 1 $cm^{-1}$ or less. This efficient waveguide characteristic results for the following reason. Since an MQW structure has a sharp absorption edge relative to a bulk structure, a waveguide loss is almost null in the case where the wavelength of guided light is longer than a band gap wavelength by 30 nm.

The application of a reverse bias between the electrodes 19B and 29 in the light modulation region 30 enables light modulation. In general, a quantum confined Stark effect causes the electric-field-induced light-absorption effect of an MQW structure to be greater than that of a normal bulk structure. In the case where the waveguide length in the light modulation region is 200 micrometers, the application of 1V electric field enables 100% modulation.

The active layers of the light source region 3 and the waveguide layers of the light modulation region 30 are composed of the same epitaxial layers or the integral epitaxial layers and have a common optical axis. Accordingly, the efficiency of the optical coupling between the light source region 3 and the light modulation region 30 can be about 80% or higher. In addition, an offset or misalignment in optical axis between the light source region 3 and the light modulation region 30 can be reliably prevented.

The electric separation between the light source region 3 and the light modulation region 30 prevents chirping and broadening of a spectrum line width which would be problems in direct modulation. Accordingly, the high-speed modulation allows high-quality laser light. In addition, the integrated laser of this embodiment can be basically fabricated in simple processes including a single-step epitaxial growth.

DESCRIPTION OF THE THIRD PREFERRED EMBODIMENT

Figure 11:
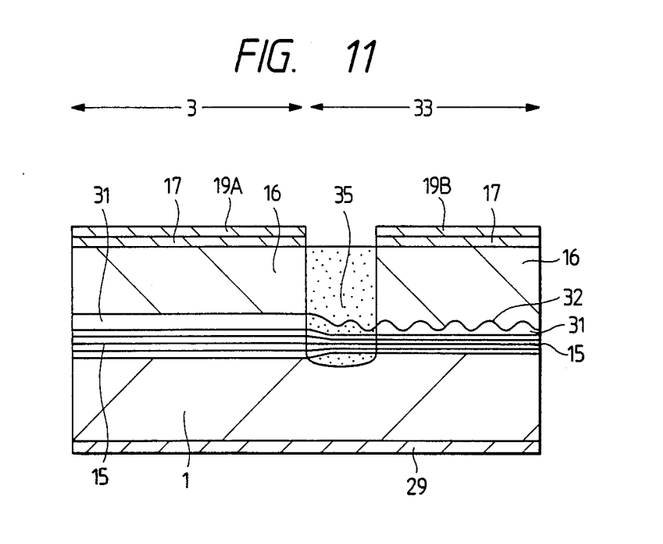
FIG. 11 is a sectional view of an integrated laser array according to a third embodiment of this invention.

FIG. 11 shows an integrated DBR (Distributed Bragg-Reflector) laser according to a third embodiment of this invention which is similar to the embodiment of FIG. 10 except for design changes indicated hereinafter.

The embodiment of FIG. 11 includes an optical feedback region 33 in place of the light modulation region 30 of FIG. 10. A grating 32 is formed on a waveguide layer within the optical feedback region 33. Accordingly, a light source region 3 is provided with no grating.

The thicknesses of layers are similar to those of the embodiment of FIG. 10. Specifically, in an MQW structure 15 within the light source region 3, the thickness of well layers is about 200 angstroms and the thickness of barrier layers is also about 200 angstroms. In the MQW structure 15 within the optical feedback region 33, the thickness of well layers is about 100 angstroms and the thickness of barrier layers is also about 100 angstroms. This design of the layer thicknesses enables an efficient waveguide path in the optical feedback region 33.

When a forward-direction dc current is passed between electrodes 19A and 29 in the light source region 3, laser oscillation occurs which emits light having a wavelength determined by the grating 32 in the optical feedback region 33. It was found that the laser oscillation occurred at a threshold current equal to or less than 15 mA. Since the oscillation spectrum is basically determined by the inactive optical feedback region 33, low chirping and narrow spectrum are ensured even in direct modulation in the light source region 3.

The application of a current or an electric field between electrodes 19B and 29 in the optical feedback region 33 enables a variation in a refractive index of the waveguide path in the optical feedback region 33 which causes a continuous change of the oscillation wavelength. Specifically, the oscillation wavelength can be varied in a range of 30 nm without any considerable change of light power output.

DESCRIPTION OF THE FOURTH PREFERRED EMBODIMENT

Figure 12:
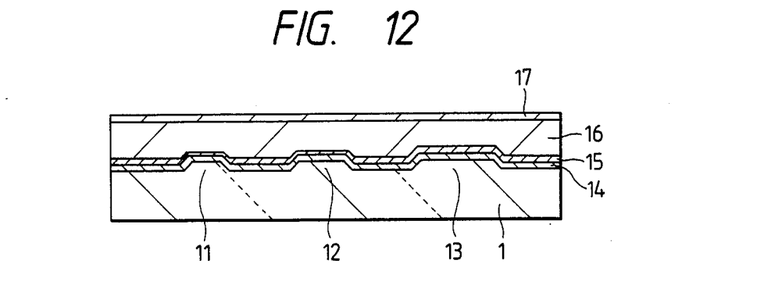
FIG. 12 is a sectional view of an integrated laser array according to a fourth embodiment of this invention.
Figure 13:
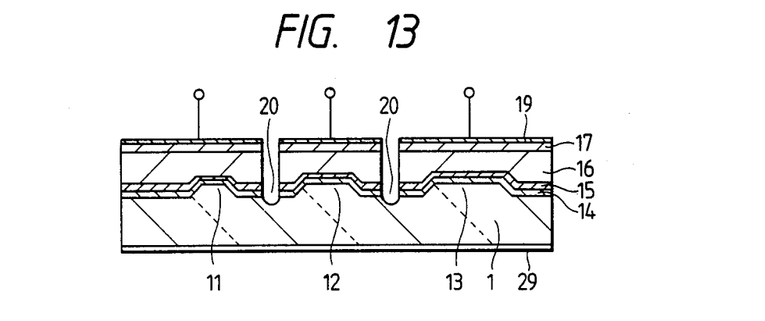
FIG. 13 is a sectional view of the integrated laser array provided with electrodes and grooves in the fourth embodiment of this invention.

With reference to FIGS. 12 and 13, an integrated multi-wavelength laser array includes an n-type InP substrate 1 provided with mesa stripes 11, 12, and 13 having widths of 6, 15, and 30 micrometers respectively. The height of the mesa stripes 11–13 is about 2 micrometers. An n-type InP layer 14 is formed on the InP substrate 1. An MQW structure 15 including active layers extends on the InP layer 14. A p-type InP layer 16 is formed on the MQW structure 15. A p-type InGaAsP contact layer 17 extends on the InP layer 16.

The laser array is fabricated as follows. Firstly, the mesa stripes 11–13 are formed on the InP substrate 1 by the steps including a patterning process using an $SiO_2$ mask, an etching process using $Hcl/H_3PO_4$-based etchant, and a mask removing process. The layers 14, 15, 16, and 17 are sequentially formed on the InP substrate 1 with the mesa stripes 11–13 in an LPE method. The thickness of the InP layer 14 is preferably 0.5 micrometers. The MQW structure 15 includes an InGaAsP well layer (wavelength corresponding to bulk band gap energy, $\lambda g = 1.30$ micrometers) and an InGaAsP barrier layer ($\lambda g = 1.05$ micrometers).

The thickness of the well layer in the mesa stripe 11 is about 200 angstroms while the thickness of the well layer in the mesa stripe 13 is about 50 angstroms. As understood from FIG. 6, the difference in wavelength between the mesa stripes 11 and 13 is about 70 nm.

As shown in FIG. 13, p-type film electrodes 19 are formed on the contact layer 17. An n-type film electrode 29 is formed below the InP substrate 1. Grooves 20 extending into the InP substrate 1 electrically separate the laser elements. The multi-wavelength laser of this embodiment emits light having wavelength of about 1.3 micrometers and other two lights having shorter and longer wavelengths. In order to improve laser characteristics, a buried structure may be formed by a second epitaxial growth.

While the first, second, third, and fourth embodiments of this invention use InGaAsP/InP-based material, this invention may use AlGaAs/GaAs-based material in place of the former material. In addition, the LPE method may be replaced by organic metal gas phase growth or molecular beam epitaxy.

What is claimed is:
1. A semiconductor device comprising:
a semiconductor substrate having a plurality of mesa stripes whose widths are different from each other;
quantum well layers formed on the mesa stripes respectively and having different band gap energies, the quantum well layers including ultra-thin epitaxial layers respectively; and
semiconductor elements formed on the mesa stripes respectively and including the quantum well layers respectively.
2. The semiconductor device of claim 1 wherein thicknesses of the epitaxial layers are equal to or less than 500 angstroms.
3. The semiconductor device of claim 1 wherein the semiconductor elements comprise a light source and an optical waveguide respectively.
4. The semiconductor device of claim 1 wherein the quantum well layers comprise respective active layers, and wherein the semiconductor elements comprise light sources having different emission wavelengths.
5. In a semiconductor laser device comprising:
a semiconductor substrate;
a light source formed on the substrate and having an active layer, laser electrodes for drive current injection, and grating, the active layer and the grating constituting a laser resonant cavity and emitting light having a wavelength determined by the grating and the cavity;
an optical waveguide formed on the substrate and having a waveguide layer guiding the light from the light source;
the improvement wherein the active layer and the waveguide layer comprise a quantum well layer, and wherein a thickness of a portion of the quantum well layer which extends in the light source is greater than a thickness of a portion of the quantum well layer which extends in the optical waveguide.
6. The semiconductor laser device of claim 5 further comprising means for electrically separating the light source and the optical waveguide.
7. The semiconductor laser device of claim 5 further comprising means for modulating the light guided by the optical waveguide.
8. In a semiconductor laser device comprising:
a semiconductor substrate;
a light source formed on the substrate and having an active layer and laser electrodes for drive current injection, the light source emitting light;
an optical waveguide formed on the substrate and guiding the light from the light source, the optical waveguide having a waveguide layer and a grating;
wherein the active layer, the waveguide layer, and the grating constitute a laser resonant cavity and cooperate to emit light having a wavelength determined by the grating and the cavity;
the improvement wherein the active layer and the waveguide layer comprise a quantum well layer, and wherein a thickness of a portion of the quantum well layer which extends in the light source is greater than a thickness of a portion of the quantum well layer which extends in the optical waveguide.
9. The semiconductor laser device of claim 8 further comprising means for electrically separating the light source and the optical waveguide.

10. The semiconductor laser device of claim 8 further comprising means for modulating the light guided by the optical waveguide.

11. A semiconductor device comprising:
a semiconductor substrate having different areas;
quantum well layers formed on the areas and each including a laminated structure of a well layer and a barrier layer;
wherein a thickness of the well layer is different for each of the areas, and the quantum well layers having respective band gap energies which are different for the respective areas due to quantum size effects; and
semiconductor device elements formed on the areas respectively and including the quantum well layers respectively.

12. The semiconductor device of claim 11 wherein the semiconductor elements comprise a light source, an optical waveguide, and a photodiode respectively, the light source having an active layer, the optical waveguide having a waveguide layer, the photodiode having a photo-absorption layer; wherein the active layer, the waveguide layer, and the photo-absorption layer are composed of the quantum well layers; and wherein the band gap energy of the quantum well layer in the light source is smaller than the band gap energy of the quantum well layer in the optical waveguide and is larger than the band gap energy of the quantum well layer in the photodiode.

13. The semiconductor device of claim 11 wherein the semiconductor elements comprise light sources having respective active layers, wherein the quantum well layers include the respective active layers, and wherein the light sources emit lights with different wavelengths which are determined by the band gap energies of the quantum well layers respectively.

* * * * *